(12) United States Patent
Conley et al.

(10) Patent No.: US 6,560,143 B2
(45) Date of Patent: *May 6, 2003

(54) METHOD AND STRUCTURE FOR EFFICIENT DATA VERIFICATION OPERATION FOR NON-VOLATILE MEMORIES

(75) Inventors: Kevin M. Conley, San Jose, CA (US); Daniel C. Guterman, Fremont, CA (US); Carlos J. Gonzalez, Los Gatos, CA (US)

(73) Assignee: SanDisk Corporation, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/040,748

(22) Filed: Dec. 28, 2001

(65) Prior Publication Data
US 2002/0126528 A1 Sep. 12, 2002

Related U.S. Application Data

(63) Continuation-in-part of application No. 09/751,178, filed on Dec. 28, 2000, now Pat. No. 6,349,056.

(51) Int. Cl.[7] .......................... G11C 16/04; G11C 16/06
(52) U.S. Cl. ........................ 365/185.04; 365/185.09; 365/185.22; 365/185.33
(58) Field of Search ..................... 365/185.04, 185.09, 365/185.22, 185.33

(56) References Cited

U.S. PATENT DOCUMENTS 5,410,544 A * 4/1995 Kreifels et al. ........ 365/185.04
5,748,939 A * 5/1998 Rozman et al. ........ 365/185.33
6,266,273 B1 * 7/2001 Conley et al. ......... 365/185.04

* cited by examiner

Primary Examiner—Trong Phan
(74) Attorney, Agent, or Firm—Skjerven Morrill LLP

(57) ABSTRACT

An improved flash EEPROM memory-based storage subsystem includes one or more flash memory arrays, each with three data registers and a controller circuit. During a flash program operation, one data register is used to control the program operation, a second register is used to hold the target data value, and a third register is used to load the next sector's data. Subsequent to a flash program operation, a sector's data are read from a flash array into the first data register and compared to the target data stored in the second register. When the data is verified good, the data from the third register is copied into the first and second registers for the next program operation. This creates an improved performance system that doesn't suffer data transfer latency during program operations that require data verification after the program operation is complete. Alternate embodiments perform the comparison using two register implementations and a single register implementations. The post-writer verification can be repeated and use different bias conditions for reading the data. The process can be automatic or executed by command that can specify the read conditions.

75 Claims, 9 Drawing Sheets

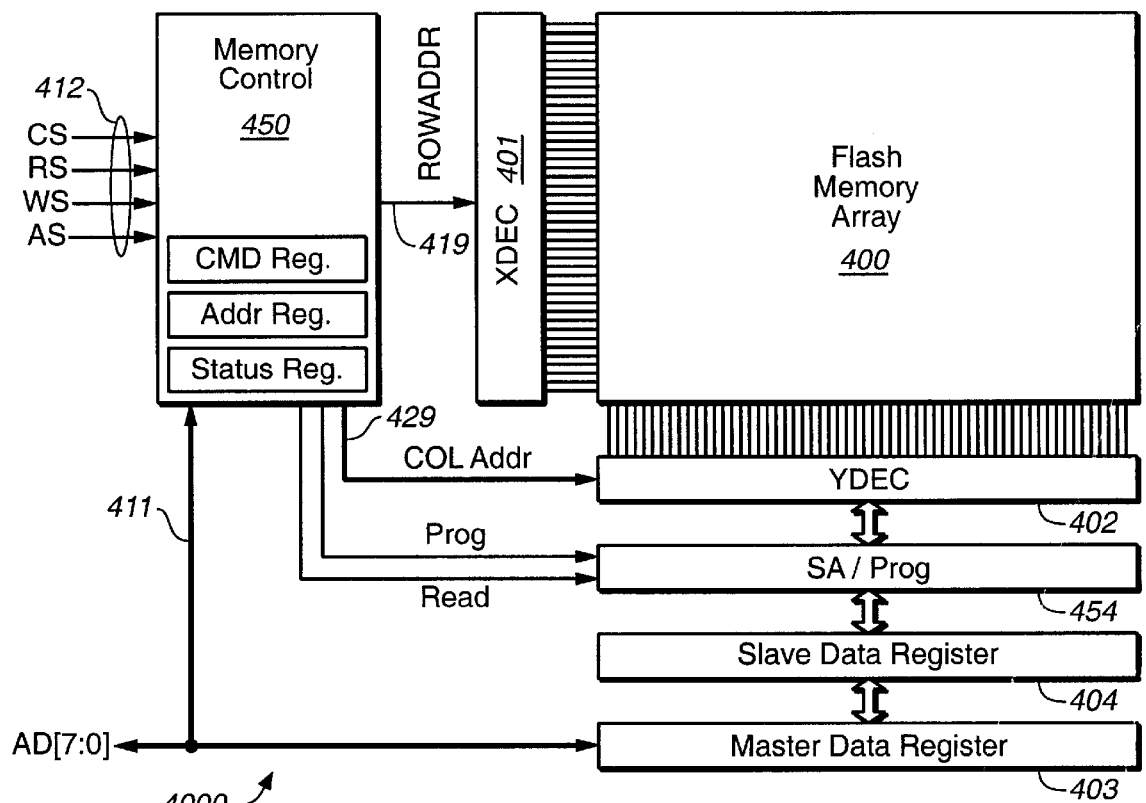
FIG._1
(PRIOR ART)
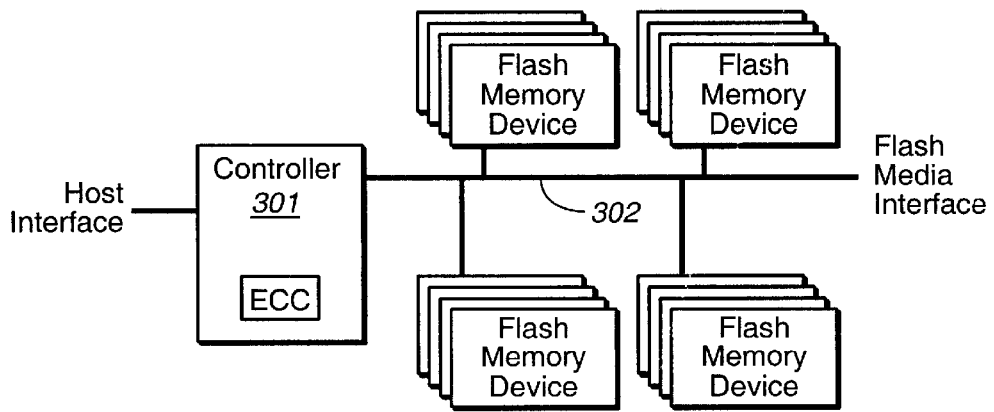
FIG._2
(PRIOR ART)

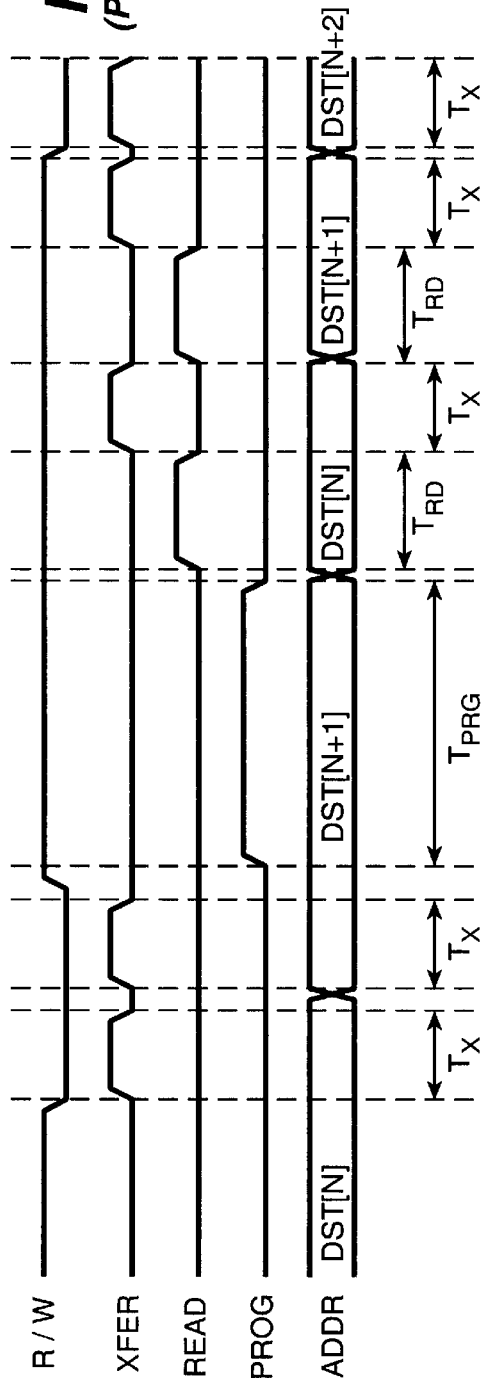
FIG._3 (PRIOR ART)
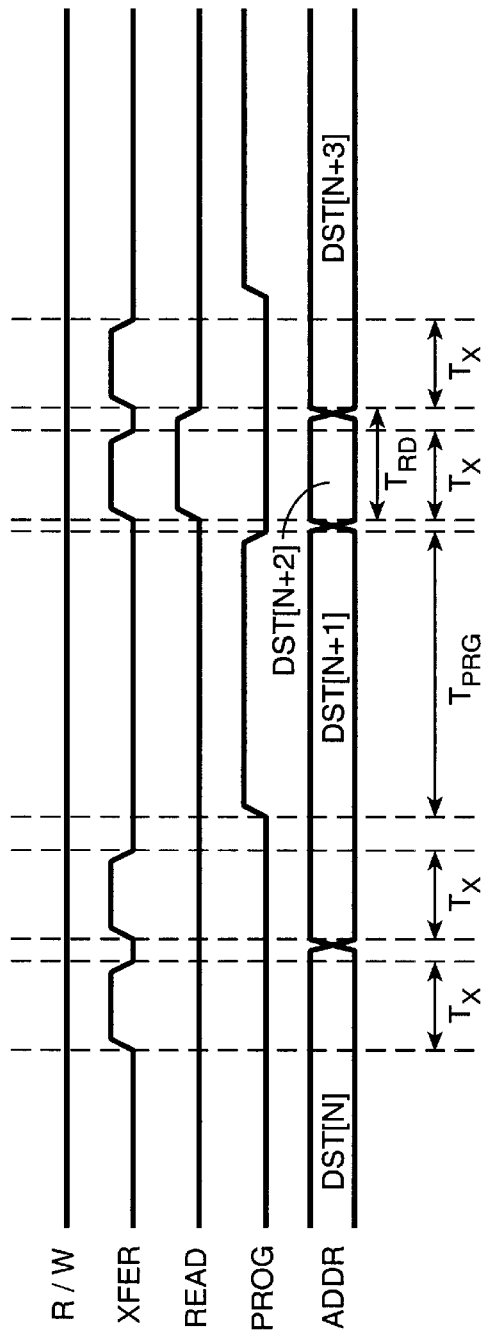
FIG._6

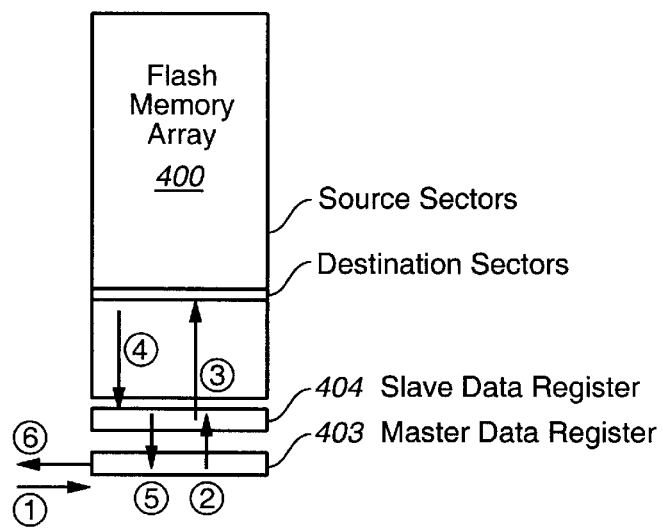
FIG._4
*(PRIOR ART)*
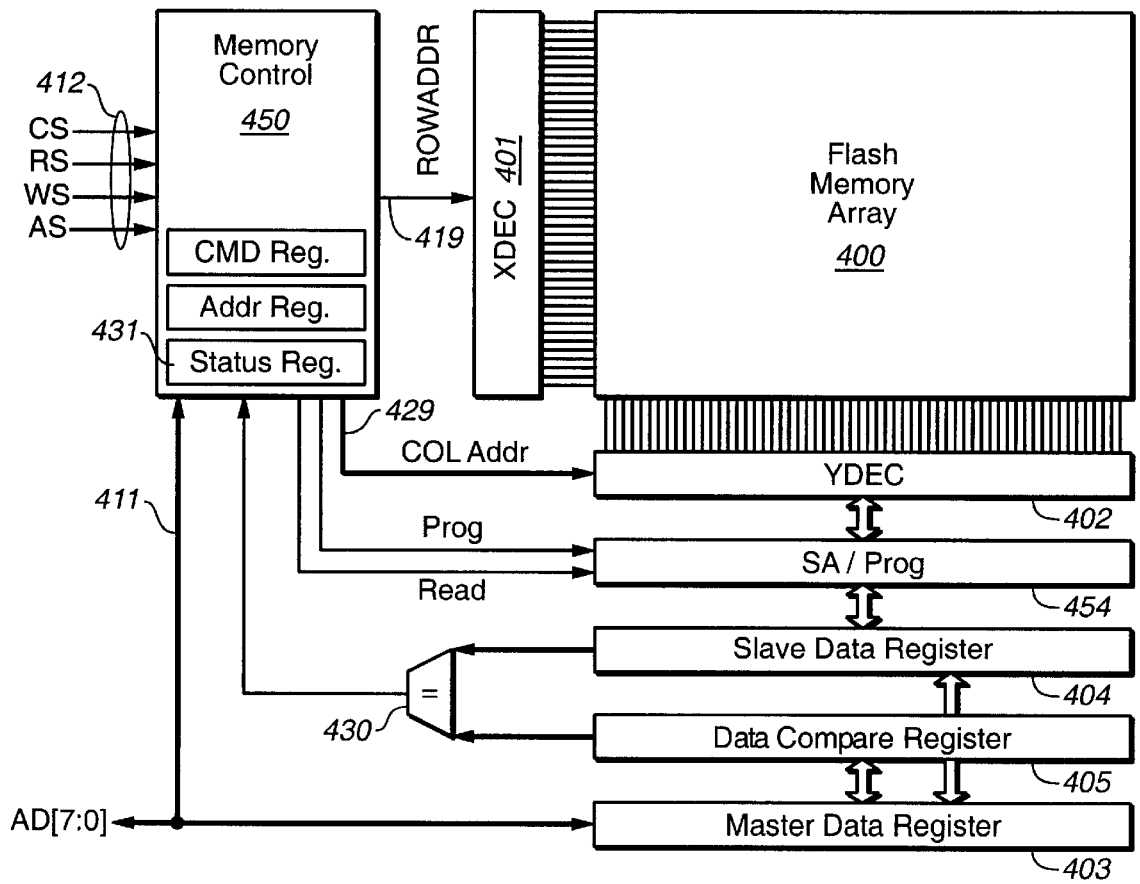
FIG._5

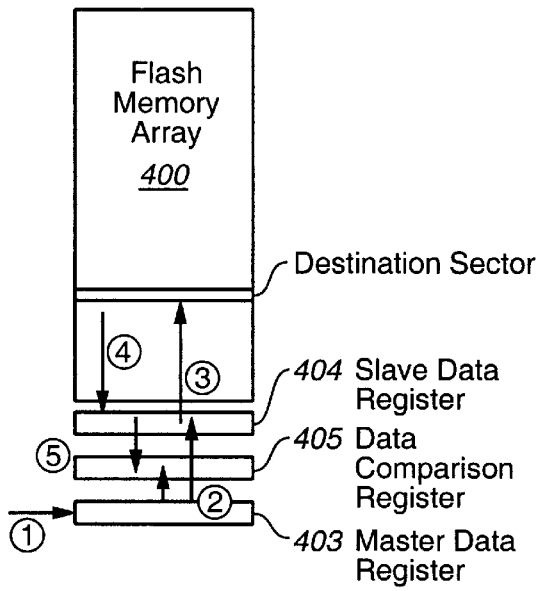
FIG._7
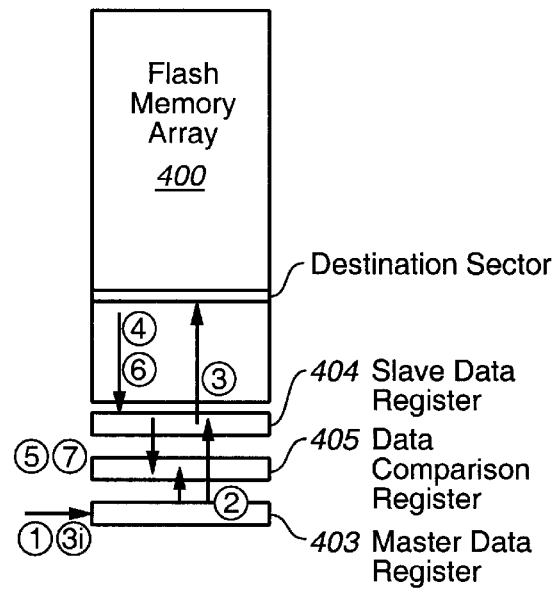
FIG._8
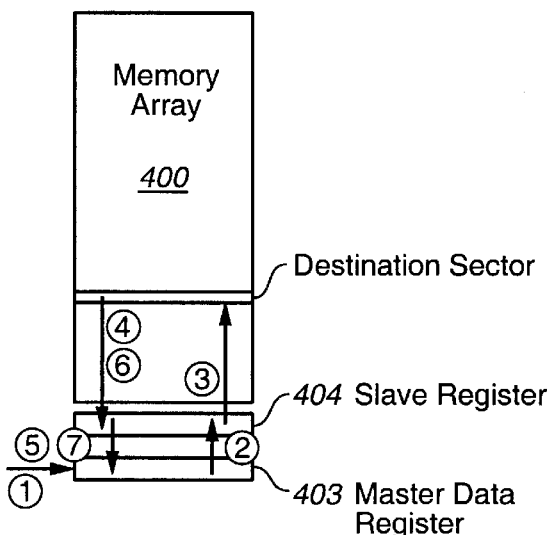
FIG._9
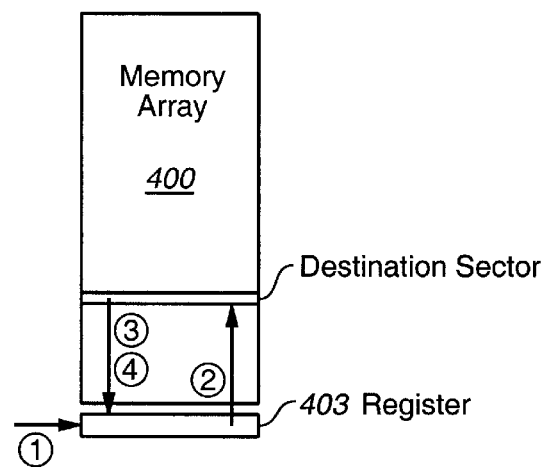
FIG._10

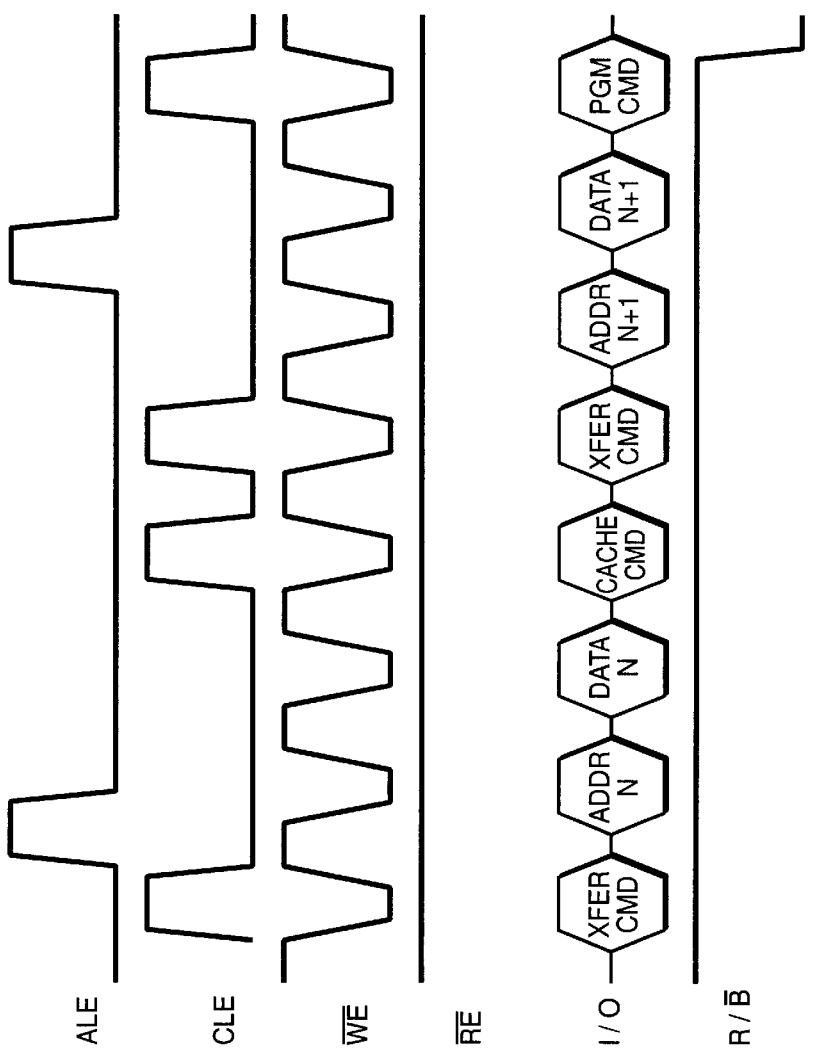
FIG._11A
FIG._11

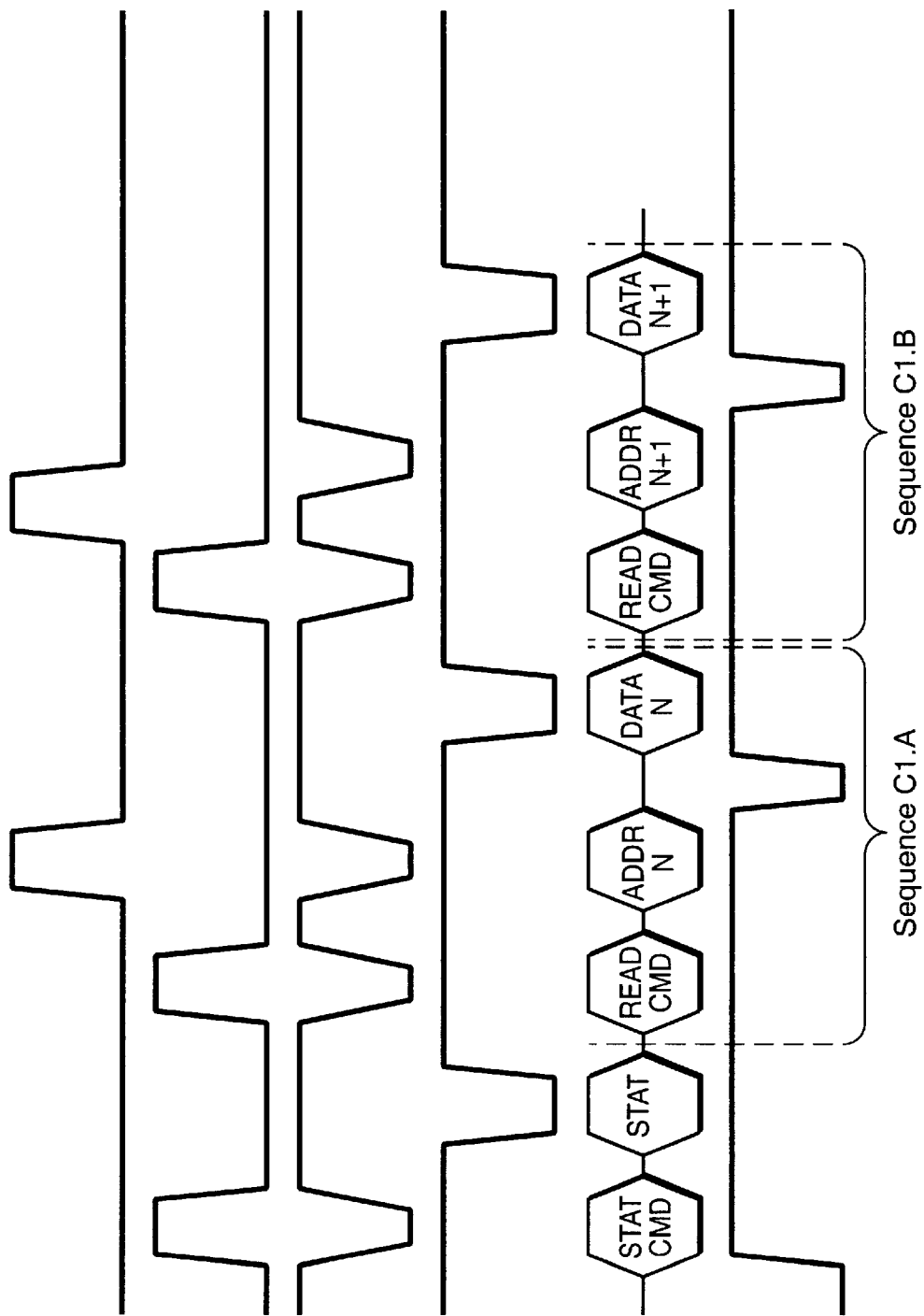
FIG._11B

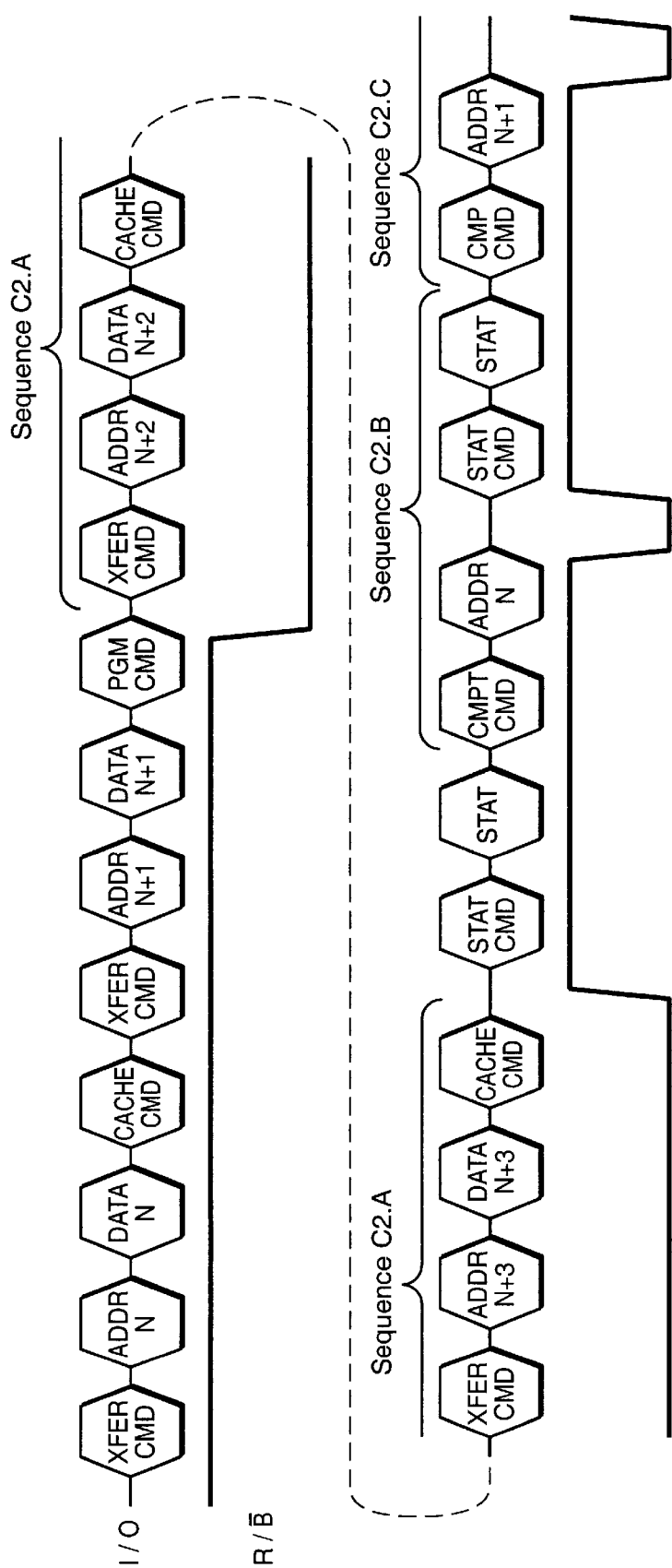
FIG._12

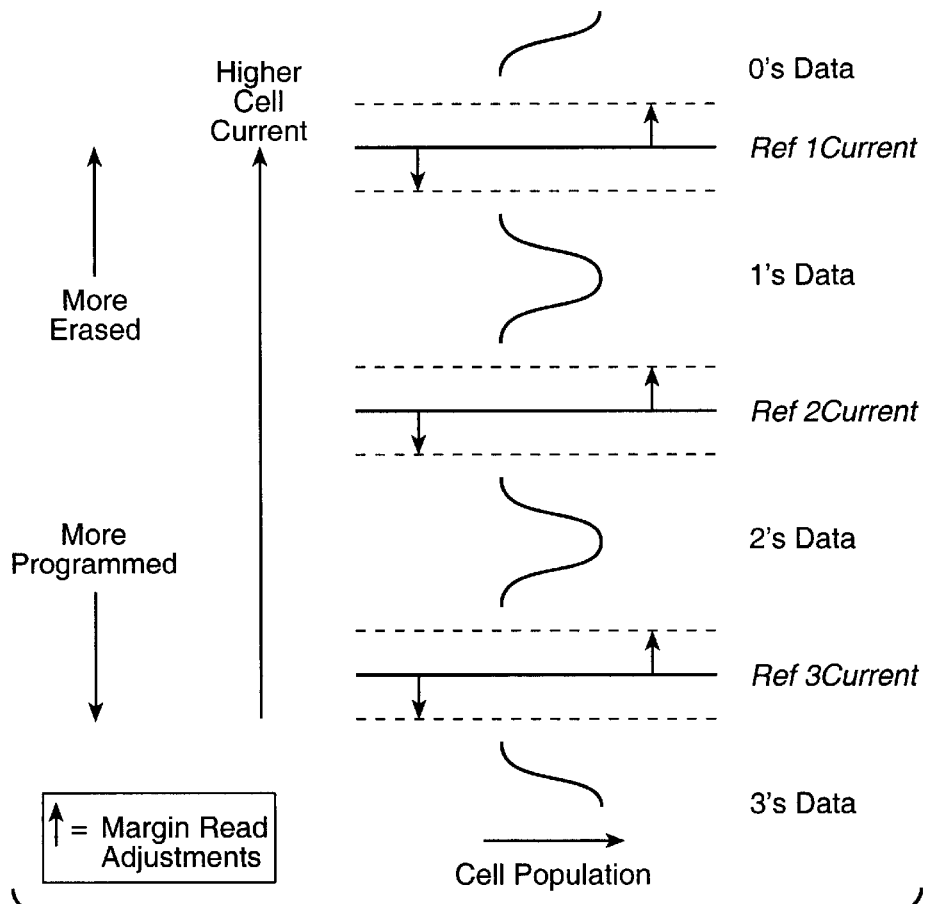
FIG._13
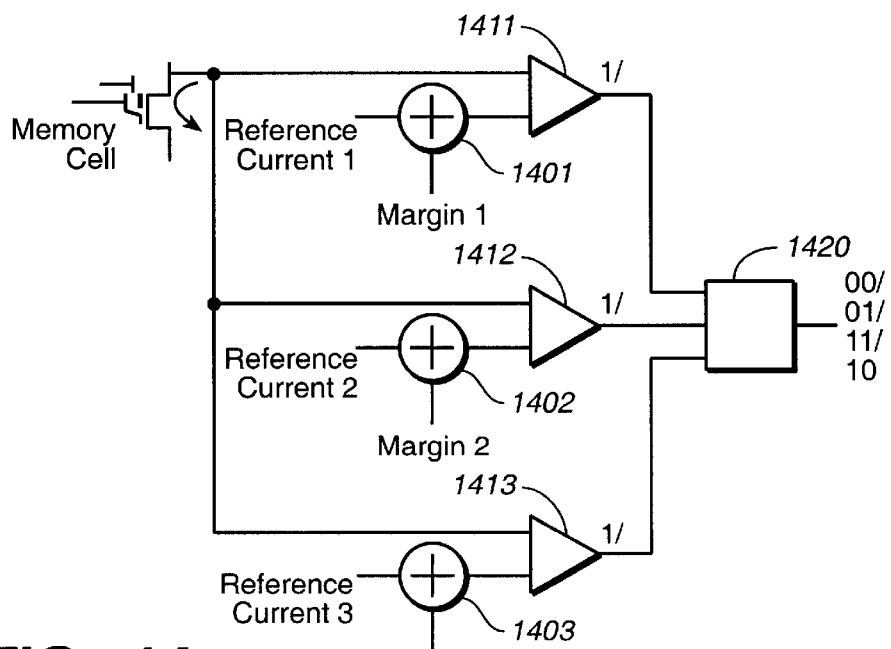
FIG._14

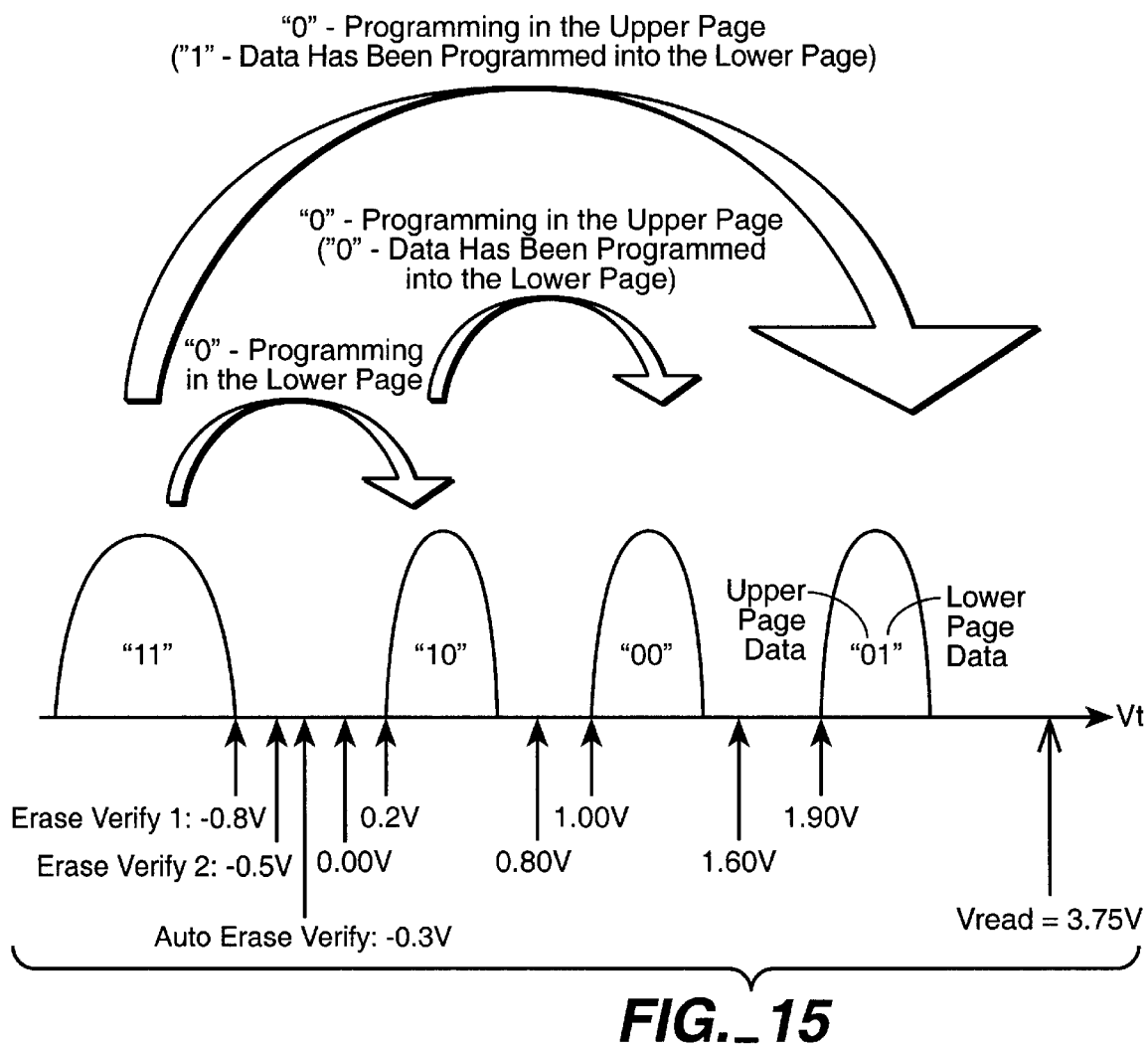
FIG._15
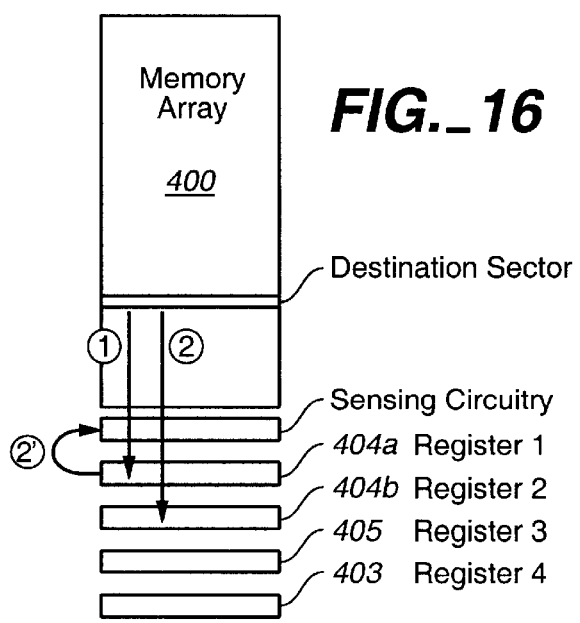
FIG._16

METHOD AND STRUCTURE FOR EFFICIENT DATA VERIFICATION OPERATION FOR NON-VOLATILE MEMORIES

RELATED APPLICATION(S)

This is a continuation-in-part application of U.S. patent application Ser. No. 09/751,178 filed on Dec. 28, 2000, now U.S. Pat. No. 6,349,056, the entire disclosure of which is incorporated herein by reference.

TECHNICAL FIELD

This invention pertains to the field of semiconductor non-volatile memory architectures and their methods of operation, and has application to flash electrically erasable and programmable read-only memories (EEPROMs).

BACKGROUND

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks. Each block is further partitioned into one or more addressable sectors that are the basic unit for read and program functions.

The subsystem controller performs a number of functions including the translation of the subsystem's logical block address (LBA) to a physical chip, block, and sector address. The controller also manages the low level flash circuit operation through a series of commands that it issues to the flash memory devices via an interface bus. Another function the controller performs is to maintain the integrity of data stored to the subsystem through various means (e.g. by using an error correction code, or ECC).

FIG. 1 shows a typical prior art flash EEPROM device's internal architecture 4000. The key features include an I/O bus 411 and control signals 412 to interface to an external controller, a memory control circuit 450 to control internal memory operations with registers for command, address and status, one or more arrays 400 of flash EEPROM cells, each array with its own row decoder (XDEC) 401 and column decoder (YDEC) 402, a group of sense amplifiers and program control circuitry (SA/PROG) 454 and a Data Register 404.

If desired, a plurality of arrays 400, together with related X decoders, Y decoders, program/verified circuitry, data registers, and the like is provided, for example as taught by U.S. Pat. No. 5,890,192; issued Mar. 30, 1999, and assigned to SanDisk Corporation, the assignee of this application, and which is hereby incorporated by reference.

The external interface I/O bus 411 and control signals 412 could be configured with the following signals:

| | |
|---|---|
| CS-Chip Select. | Used to activate flash memory interface. |
| RS-Read Strobe. | Used to indicate AD bus is being used for a data read operation. |
| WS-Write Strobe. | Used to indicate AD bus is being used for a data write operation. |
| AS-Address Strobe. | Indicates that AD bus is being used to transfer address information. |
| AD[7:0]-Address/ Data Bus | Used to transfer data between controller and flash memory command, address and data registers. |

This interface is given only as an example as other signal configurations can be used to give the same functionality. This diagram shows only one flash memory array 400 with its related components, but a multiplicity of arrays can exist on a single flash memory chip that share a common interface and memory control circuitry (MEMORY CONTROL) 450 including CMD REG, ADDR REG, and STATUS REG) but have separate XDEC, YDEC, SA/PROG and data registers (SLAVE DATA REGISTER 404 and MASTER DATA REGISTER 403) circuitry in order to allow parallel read and program operations.

Data from the EEPROM system 4000 data register (SLAVE DATA REGISTER) 404 to an external controller via the data registers coupling to the I/O bus AD[7:0] 411. The data register 404 is also coupled the sense amplifier/ programming circuit 454. The number of elements of the data register coupled to each sense amplifier/programming circuit element may depend on the number of bits stored in each flash EEPROM cell. Each flash EEPROM cell may include a plurality of bits, such as 2 or 4, if multi-state memory cells are employed.

Row decoder 401 decodes row addresses for array 400 in order to select the physical sector being accessed. Row decoder 401 receives row addresses via internal row address lines 419 from memory control logic (MEMORY CONTROL) 450. Column decoder 402 receives column addresses via internal column address lines 429 from memory control logic (MEMORY CONTROL) 450. SA/PROG 454 receives PROG and READ form MEMORY CONTROL 450.

FIG. 2 shows a typical flash card architecture that has a single controller 301 that performs host and memory control functions and a flash memory array that is composed of one or more flash memory devices. The system controller and the flash memory are connected by bus 302 that allows controller 301 to load command, address, and transfer data to and from the flash memory array.

It is common practice that each sector's worth of host data programmed into a sector is appended with an Error Detection and Correction Code (ECC) that is used to determine the validity of the stored data upon read back. Some such systems would use the occasion of the transfer from the memory device to the controller as an opportunity to check the validity of the data being read as a way to ensure that the data has not been corrupted.

In order to ensure the validity of the data programmed, some systems read the data from a sector immediately after it is programmed. The data is verified before the next operation proceeds by means of ECC, data comparison, or other mechanism. In prior art systems, this data verification, as it is known to those experienced in the art, occurs during the data transfer that takes place after the read. Thus there is an increase in the time to perform a program operation due to the addition of a read operation and the transfer of the data from the flash memory device to the controller circuit, where the verification is actually performed. The program verify operation indicates whether or not all cells have been programmed to or above the desired level and does not generally check if cells have over-shot the target state, possibly to the next state in the case of multi-state memory, but only if they have exceeded a particular verification condition. Due to the overall fidelity of these storage devices, the occurrence of failure during such verifications is rare.

FIG. 3 shows a timing diagram of a two-sector program/verify operation in which data is programmed into two destination addresses (DST[N] and DST[N+1]) and subsequently read in order to verify before programming to the next destination address (DST[N+2]). The READ signal indicates that a read is taking place from the source sector. The XFER signal indicates a data transfer between the flash data register and the controller. The R/W signal indicates the direction of the transfer (high being a read from the flash to the controller and low being write from the controller to the flash). The PROG signal indicates that a program operation is taking place upon the destination page.

FIG. 4 illustrates the sequence of events that occur during a program/verify operation:

1. Transfer data to master data register 403 from external controller circuit (not shown).
2. Transfer contents of master data register 403 to slave data register 404.
3. Program the data from slave data register 404 into flash memory array 400 (containing the DESTINATION SECTORS and SOURCE SECTORS).
4. Read back data from flash memory array 400 into slave data register 404.
5. Transfer data from slave register 404 to master data register 403.
6. Transfer data from master data register 403 to external controller circuit (not shown) for validation.

The exact cost of these verification operations varies depending on the times of various flash memory operations, the data set size, the I/O bus size and the I/O bus cycle time. But an example using some typical values is shown below:

$$T_{RD}=25 \ \mu s \ T_X=26.4 \ \mu s \ T_{PRG}=300 \ \mu s$$

The total time to program and verify a single sector (as shown in FIG. 4).

$$T_{Pgm/Vfy}=T_X+T_{PRG}+T_{RD}+T_X=377 \ \mu s$$

Making the data verification time 14% of the overall program/verify operation.

It is a general trend in non-volatile memory design to increase the number of cells that can be programmed and read at one time in order to improve the write and read performance of these devices. This can be accomplished by increasing the number of memory cell arrays on a single die, increasing the page size within a single plane, programming multiple chips in parallel or some combination of these three techniques. The result of any of these is that the data transfer length increases for the larger number of cells being programmed or read with the program and read times changing little or not at all. Thus, the expense of data verification in a system that has such increased parallelism is that much higher. As an example, the same timing values as used in the above example show the impact on a system with a four-fold increase in parallelism:

$$T_{Pgm/Vfy}=4*T_X+T_{PRG}+T_{RD}+4*T_X=526.4 \ \mu s$$

Making the data verification time 24% of the overall four-page copy operation.

SUMMARY

A flash memory device is taught which is capable of performing a post-programming verification operation without transferring the data to an external controller circuit and which allows data transfer from the external controller during those program or verify operations. According to a principle aspect of the present invention, a copy of the data to be programmed is maintained on the memory device. After programming is complete, the data is read back compared with the maintained copy in a post-write read-verify process performed on the memory device itself.

In one set of embodiments, non-volatile memory system is designed with circuitry that includes three data registers. The first data register controls programming circuitry and stores data from read operations. The second data register holds a copy of the programming data for later verification. The third data register is used to transfer data during program, verify and read operations. This process of transferring in the next set of data to be programmed while a current set of data is being programmed can be termed stream-programming. Prior to a program operation, data is transferred into the first and second registers. Subsequent to the programming operation, the data are read back from the cells just programmed and are stored in the first register. The contents of that register are then compared with the contents of the second register. A match between the two sets of data indicates that the data was programmed correctly and status indicating a successful verification is produced. During the program and verify operations, the third data register can be used to receive the next set of data to be programmed.

An alternate set of embodiments is a two register implementation, in which a master register receives the incoming data and maintains a copy of the data subsequent to its programming. After the data is written, it is read out into a second register whose contents are then compared to the original data in the master register. Another alternate embodiment uses only a single master register, with the data again maintained in the master register subsequent to programming and the read data is compared directly with the contents of the master register as it is read out of the array. These variations allow for both destructive (wherein the data in register used for programming is lost in the process of program-verification) and non-destructive (wherein the data is maintained throughout) programming methods to be used.

In all of the embodiments, the post-programming verification operation can be repeated, where the additional verifications can be performed using different read conditions to ensure proper amounts of read margin exist. In another aspect of the invention, the various embodiments can write multiple data sectors in parallel, with the post-programming verification operation being performed on the different sectors either serially or in parallel. The post-programming verification can be an automatic process on the memory device or performed in response to a command from the controller. The it command can specify the type of read to be used in the verification or specify parameters, such as a set of margining levels, to use for the read. The memory can use either binary or multi-state memory cells. In a multi-state embodiment, the addressing can be memory level.

Additional aspects, features and advantages of the present invention are included in the following description of specific representative embodiments, which description should be taken in conjunction with the accompanying drawings.

BRIEF DESCRIPTION OF THE DRAWINGS

FIG. 1 shows a block diagram of a typical prior art EEPROM.

FIG. 2 shows a typical flash-based storage subsystem architecture of the prior art.

FIG. 3 shows a timing diagram of a two-sector program/verify operation of the prior art.

FIG. 4 illustrates the sequence of events that occur during a program/verify operation in a prior art system.

FIG. 5 shows a schematic representation of a semiconductor non-volatile memory according to one embodiment of the present invention.

FIG. 6 illustrates a timing diagram for a two-sector program/verify operation embodiment of the present invention.

FIG. 7 illustrates the sequence of events that occur during a program/verify operation in an embodiment of the present invention.

FIG. 8 illustrates the sequence of events that occur during a program/multiple-verify operation in an embodiment of the present invention.

FIG. 9 illustrates the sequence of events that occur during a program/multiple-verify operation in an alternate embodiment of the present invention.

FIG. 10 illustrates the sequence of events that occur during a program/multiple-verify operation in another alternate embodiment of the present invention.

FIGS. 11 and 12 are timing diagrams illustrating the use of stream programming.

FIG. 13 schematically illustrates cell populations and margin read conditions in a multi-state memory.

FIG. 14 shows one possible manner of altering read conditions.

FIG. 15 illustrate the process of addressing memory cells by their state.

FIG. 16 is an example of register usage in an embodiment of the present invention when addressing memory cells by their state.

DETAILED DESCRIPTION

The present invention comprises both a system for and a method of performing program/verify operations on a flash memory device that do not require data to be transferred from the memory device in order to allow an external controller to simultaneously transfer data to the device for subsequent programming operations. The post-program read-verify process of the present invention (often referred to loosely as just a verify or verification below, depending on context) needs to be distinguished from the program-verify process that occurs as part of the actual programming process and that is common in the prior art. In a principle aspect, a copy of the data is maintained on the memory device during programming. The compare process of the present invention is separate from, and subsequent to, the programming process and uses an actual read process to provide the data that is compared with the maintained copy. FIG. 5 shows a diagram representing a semiconductor non-volatile memory that is constructed in accordance with one embodiment of this invention. The descriptions of each component in this diagram are similar to that previously described with respect to FIG. 1, with the following exceptions: there is an additional Data Comparison Register 405 and associated comparison logic 430 for the purpose of performing the data verification operation. In one embodiment of this invention, the register that stores sensed data and provides the data to be programmed is designed in such a way that the memory element for both operations is physically the same.

Such a data register circuit suitable for use with this invention is detailed in the aforementioned U.S. Pat. No. 5,890,152. Another suitable set of register/data latch circuits is described in a U.S. patent application entitled "Dynamic Column Block Selection" by Raul Adrian Cernea, filed on Sep. 17, 2001, and which is hereby incorporated by reference. The various registers, such as master data register 403, slave data register 404 and data compare register 405, are large enough to hold all data programmed in parallel, or there are as many sets of the pertinent register per sector being programmed in parallel, according to the embodiment described. FIG. 6 shows a timing diagram of a two-sector program/verify operation in which data is programmed into two destination addresses (DST[n] and DST [n+1]) and subsequently read in order to verify. Simultaneous with the read is the data transfers for the next pair of sectors to be written to addresses DST[N=2] and DST[n+3]. The READ signal indicates that the two sectors are being read in parallel from the addresses just programmed. The XFER signal indicates a data transfer between the flash data register and the controller. The R/W signal indicates the direction of the transfer (high signifies transfer to the controller, low signifies to the flash). Note that the R/W signal is constantly low since no data transfer takes place from the flash memory to the controller. The PROG signal indicates that the program operation is taking place upon the destination pages.

FIG. 7 illustrates the sequence of events that occur during a program/verify operation according to this three register embodiment of the invention. In FIG. 7, the Y-decoder YDEC 402, sense/program circuit SA/PROG 454, and other elements of FIG. 5 are suppressed to simplify the discussion. The process of FIG. 7 includes:

1. Transfer data from external controller circuit (not shown) to master data register 403.
2. Transfer contents of master data register 403 to slave data register 404 and data comparison register 405, for example simultaneously.
3. Program the data from slave data register 404 into flash memory array 400 (DESTINATION SECTOR).
4. Read data back from flash memory array 400 into slave data register 404. Simultaneously, begin data transfers from the external bus for the next program operation (step 1) into the master data register 403.
5. Compare (430) data in slave register 404 to that in data compare register 405. The result of this comparison is saved in status register 431 which can, for example, be read by an external controller.
6. If the comparison fails, the external controller can apply the appropriate error recovery measures.

In an alternate embodiment, data transfers from the external bus to master data register 403 take place simultaneously with one or more of the steps of programming, reading data back, and comparing in a "stream programming" process. There are many alternate ways to handle error conditions. These may include writing the data to a different area of the memory and erasing or marking as bad the failing portion of memory, applying more pulses without an intervening erase, or erasing and re-writing the data to the same area. Alternately, no action may be taken if there are fewer than some number of errors.

The exact cost in terms of time and performance of these verification operations varies depending on the times of the various flash memory operations, the data set size, the I/O bus width and the I/O bus cycle time. But an example of the operation of this invention using some typical values is shown below:

$$T_{RD}=25\ \mu s\ T_X=26.4\ \mu s\ T_{PRG}=300\ \mu s$$

The total time to program and verify a single sector (as shown in FIG. 4).

$$T_{Pgm/Vfy}=[T_X+T_{PRG}+T_{RD}]=351.4\ \mu s$$

This represents a 7% improvement in the program time from the single sector prior art example.

It is a general trend in non-volatile memory design to increase the number of cells that can be programmed and read at one time in order to improve the write and read performance of these devices. This can be accomplished by increasing the number of memory cell arrays on a single die, increasing the page size within a single plane, programming multiple chips in parallel or some combination of these three techniques. The result of any of these is that the data transfer length increases for the larger number of cells being programmed or read with the program and read times changing little or not at all. Thus, the expense of data verification in a system that has such increased parallelism is that much higher. Using the four-sector example from before, $$T_{Pgm/Vfy}=4*T_X+T_{PRG}+T_{RD}=426\ \mu s$$

This represents a 20% improvement in the program time from the four sector prior art example.

FIG. 7 present s a single, post-programming read-verify operation in steps 4 and 5. This post-programming read-verify operation needs to be distinguished form the verify process that occurs as part of the actual programming process and that is common in the prior art. The compare process of FIG. 7, and of the alternate embodiments below, is separate from, and subsequent to, the programming process and uses an actual read process to provide the data that is compared based upon the cell level, whereas the program verify process compares the cell level against a fixed target value.

In program-verify processes, a distinction needs to be made between destructive and non-destructive program-verify schemes. A destructive program-verify scheme corrupts the contents of the slave register during the program-verify operation as the storage elements are verified to the proper level. The contents of the register are used as feedback to the programming circuitry to indicate whether or not a given storage element requires more programming; once verified to the appropriate level, the register contents corresponding to the verified storage element are cleared to inhibit further programming. The programming operation is complete once all contents of the slave register are cleared, or when the verify status of all storage elements indicate successful programming. A non-destructive program-verify scheme does not corrupt the contents of the slave register. This scheme would allow storage elements to receive more programming steps even after they have verified to the appropriate level. The programming operation would terminate when all storage elements had reached a programmed state, the detection of said condition requiring monitoring of the program-verify results for all storage elements to detect completion. In the prior art, flash memory devices typically employ a destructive program-verify scheme, and particularly in multi-level devices. Non-destructive techniques may also be used in flash memory systems when the use of additional pulsing will not adversely affect the distribution of the cells' states to an excessive degree. Non-destructive program-verify schemes can also be used in memory systems with other forms of storage elements that can tolerate the additional stress.

The embodiment described above with respect to FIG. 7 accommodates both a destructive program-verify scheme and stream programming. Because a copy of the data is save in the compare register, the slave register need not maintain the data during programming. Furthermore, once the master register transfers its contents to the compare and slave registers, it is free to receive the next set of data. By dispensing with stream programming, utilizing a non-destructive program-verify scheme, or both, a post-programming read-verify operation can be implemented with fewer registers. If the device employs a non-destructive program-verify scheme, the compare register is not needed, and the data in the slave register can be compared directly against the sense amp output.

In an alternative embodiment, more than one post-programming read-verify operation can be performed, for example either after each write operation, or after only certain write operations, as specified for example by the number of write operations performed since the previous multiple-verification operation, randomly, based on elapsed time since the previous multiple-verification operation, upon an erase verify failure, based on the number of erase cycles, or upon program-verify failure. The verifications can be performed under various conditions, such as nominal voltage threshold, low margin voltage threshold, and high margin voltage threshold in a voltage sensing scheme, as is described more below with respect to FIG. 13. This use of different voltage levels further distinguishes the post-write read-verify operation of the present invention from the traditional verify that forms part of the program process.

An erase verify failure occurs when the memory returns a verify fail status after an erase operation, in which case the erase operation likely failed, although the block may be erased enough to use under normal conditions. This is due to the fact that the erase verify may check for cells to be erased to a much more erased state than actually needed, thereby providing more guard-band than required for normal use. This is described, for example, in U.S. Pat. Nos. 5,172,338 and 5,602,987, which are hereby incorporated by reference. An alternate way of checking whether or not a block is usable after erase is to perform a read after erase under conditions biased to check for erase failure, generally margined to check for cells not sufficiently erased. Performing such a read after every erase would cause the system to suffer a performance penalty, so it is generally avoided. Many prior art flash memory systems have ignored the verify status of erase operations, and checked only the results of the post-write read-verify operations. In one embodiment of the present invention, an extra post-write read-verify operation biased toward checking for insufficiently erased cells is performed only in the case of an erase verify fail status. If the block were to pass these read-verify conditions, the block would be deemed usable under normal conditions, despite the erase verify failure.

Invoking multiple read-verify operations based on the number of erase cycles is similar to basing the decision upon the number of write operations performed since the previous multiple-verification operation, since erase operations and program operations are generally one-to-one. In a variation, the use of multiple verify operations could be triggered by the number of erase operations performed since the previous multiple-verification operation instead of the total number of erase cycles. U.S. Pat. No. 5,095,344, which is hereby incorporated by reference, discusses the maintenance of the number of erase cycles in a flash memory storage system.

Concerning the program verify failure criterion for triggering additional post-write read-compares, it should be noted that the program verify is the status returned by the memory after a program operation indicating whether or not all cells have been programmed to or above the desired level. This program verify is different than the post-write read-verify specified in the invention, which is an actual read of cells to determine their specific state. The program verify does not generally check if cells have over-shot the target state, possibly to the next state in the case of multi-state memory.

FIG. 8 presents a three-register implementation of an embodiment with two post-write compare verifications. When compared with FIG. 7, the steps 6 and 7 have been added for the extra compare. The process also includes an optional transfer of data during phase 3 (a "stream programming" operation) that is not shown explicitly in FIG. 7, although it may also be used there. The variation of FIG. 8 also differs from the above sequences in that the initiation of data transfer for the next program operation coincides with the initiation of the current programming operation, rather than with the read verify. As the programming operation is longer, this allows more data transfer time to occur in parallel. The corresponding timing diagram is depicted below in FIG. 12.

The sequence of events that occur during a program/verify operation according to this invention as shown in FIG. 8 include:

The sequence of events that occur during a program/verify operation according to this invention as shown in FIG. 8 include:

1. Transfer data from external controller circuit (not shown) to master data register 403.
2. Transfer contents of master data register 403 to slave data register 404 and data comparison register 405, for example simultaneously. Alternately, the data comparison register 405 can be loaded after loading the slave data register 404, but prior to step 5.
3. Program the data from slave data register 404 into memory array 400 (DESTINATION SECTOR).
    i. Once the contents of master data register 403 have been transferred to slave data register 404 and data comparison register 405, begin data transfers from the external bus for the next program operation (step 1) into the master data register 403. This can begin simultaneously with the programming.
4. Read data back from memory array 400 into slave register 404 under conditions desired for given iteration of read verification.
5. Compare (430) data in slave register 404 to that in data compare register 405. The result of this comparison is saved in status register 431 that can, for example, be read by an external controller.
6. Determine if one or more additional read verifies are to be made, for example due to one of the above-mentioned criteria. Repeat steps 4–5 for all desired iterations under the desired, and possibly different, read conditions for each iteration.
7. If the comparison fails, the external controller can apply the appropriate error recovery measures, as described above.

As before, the exact time/performance cost of these verification operations varies, but using the same exemplary values as above for the individual operation times, the prior art single-sector example of FIG. 4 with two post-write compare verifications gives:

$$T_{Pgm/Vfy}=T_X+T_{PRG}+T_{RD}+T_X+T_{RD}+T_X=429 \; \mu s$$

For the prior art four-sector parallel example with two post-write compare verifications:

$$T_{PGM/VFY}=4^*T_X+T_{PRG}+T_{RD}+4^*T_X+T_{RD}+4^*T_X=666 \; \mu s$$

For the embodiment of the invention as shown in FIG. 8, the single-sector example is:

$$T_{PGM/VFY}=T_X+T_{PRG}+T_{RD}+T_{RD}=376 \; \mu s$$

and in the case of the four-sector parallel example:

$$T_{PGM/VFY}=4^*T_X+T_{PRG}+T_{RD}+T_{RD}=455 \; \mu s$$

These respectively represent al 2% improvement and a 32% improvement. Note that these savings do not take into account the performance improvements due to stream programming, which is achieved by transferring the data to be programmed into subsequent sectors during programming of the current sectors.

The embodiments described so far all use distinct registers to store a copy of the data, data compare register 405, and to hold the data transferred to and from the read/write circuit 454, slave data register 404. An alternate set of embodiments uses only a master and a slave register in a two-register implementation in which the master also serves as the compare register. In such an embodiment, it is possible to perform the data compare, but it would not be possible to start the next data transfer from the host into the flash memory controller until after the full program/verify operation was complete.

Both a single post-write compare verification and a multiple post-write compare verification, shown for the three register embodiment in FIGS. 7 and 8 respectively, can be used in two and one register embodiments. In a two register embodiment, either stream programming is eliminated or a non-destructive program-verify scheme must be used; in a single register embodiment, both measures are taken, as described in the matrix below.

| Pgm-Vfy No of Regs | Destructive | Non-Destructive |
|---|---|---|
| 1 | Not possible | No stream-programming Compare MstReg-SenseOut |
| 2 | No stream-programming Compare MstReg-SlvReg or Compare MstReg-SenseOut | Stream Programming Compare SlvReg-SenseOut |
| 3 | Stream-programming Compare CmpReg-SlvReg Or Compare CmpReg-SenseOut | Stream Programming Compare SlvReg-SenseOut Extra register, or Compare SlvReg-CmpReg |

The first entry in the 3 register, destructive block of the matrix is the process described with respect to FIGS. 7 and 8. In a variation, the compare register (CmpReg) can be compared directly with the output of the sensing process, similar to the process described below for the 1 register, non-destructive embodiment. In the 2 register, destructive case, since the compare register (CmpReg) is absent, no stream-programming is possible as the master register maintains a copy of the data for comparison with either the slave register (SlvReg) or the sense output. A 1 register, destructive process is not available as there will be no intact copy of the data on the memory to use for the comparison.

In the non-destructive column, a 3 register embodiment allows stream programming as the master register is free once it has transferred the current data set. In this case, as in the destructive case, the result of the programming can be read and stored in the slave register and compared with the contents of the compare register. Alternately, as the slave register maintains a copy of the data, this saved copy in the slave register can be compared with the sense output directly, in which case the compare register is redundant. Removing this now redundant compare register results in the 2 register, non-destructive case. If instead of using a slave register, the non-destructive programming of data is performed directly from the master register, a 1 register embodiment is possible with the maintained data in the master being compared directly with the sense output. In this single register embodiment, stream-programming is not available. Note in the above that the compare may be made against the sense output directly in any scheme.

FIG. 9 shows an example of a two-register implementation with non-destructive program-verify and two write compare verify operations. Master and compare duties are shared by a single register, so that 405 and 403 of FIG. 5 are now the same, with 430 now connected to 404 on one input and the master data register 403/405 on the other. The master maintains the data subsequent to programming to perform the comparison.

The process for the embodiment in FIG. 9 is similar to that described with respect to FIG. 8:

1. Transfer data from external controller circuit (not shown) to master data register 403.
2. Transfer contents of master data register 403 to slave register 404. The data is maintained in the master data register 403.
3. Program the data from slave register 404 into memory array 400 (DESTINATION SECTOR). As the master data register 403 is maintaining a copy of this data, the can be no stream programming in this case unless additional registers are available.
4. Read data back from memory array 400 into slave register 404 under conditions desired for given iteration of read verification.
5. Compare (430) data in slave register 404 to that master data register 403. The result of this comparison is saved in status register 431 that can, for example, be read by an external controller.
6, 7. If one or more additional read verifies are to be made, for example due to one of the above-mentioned criteria, steps 6 and 7 repeats steps 4 and 5 for all desired iterations under the desired read conditions for each iteration. If the comparison fails, the external controller can apply the appropriate error recovery measures as before.

Both the single post-write compare verification process and the multiple post-write compare verification process can be done in a single register embodiment if a non-destructive program-verify scheme is used. FIG. 10 illustrates such an arrangement for a two part write compare verify operation. In this set of alternate embodiments, the compare is done simultaneous with end of the read process, rather than storing the read data in a register and comparing the stored contents of this register. The slave and compare registers (respectively 405 and 404) of FIG. 5 are now absent, with 430 now connected to the sense circuitry of SA/PROG 454 on one input and the master data register 403 on the other. As with FIG. 9, the data is maintained in the master data register 403; unlike in FIG. 9, the array is programmed from the master data register without destroying the data set. The process for a two post-write compare verification process in the embodiment shown in FIG. 10 is as follows:

1. Transfer data from external controller circuit (not shown) to master data register 403.
2. Program the data from master data register 403 into memory array 400 (DESTINATION SECTOR). The data is maintained in the master data register 403. As the master data register 403 is maintaining a copy of this data, the can be no stream programming in this case unless additional registers are available.
3. Read data back from memory array 400 under conditions desired for given iteration of read verification and directly compare to the data in master data register 403. The result of this comparison is saved in status register 431 that can, for example, be read by an external controller.
4. If one or more additional read verifies are to be made, for example due to one of the above-mentioned criteria, step 4 repeats step 3 for all desired iterations under the desired read conditions for each iteration. If the comparison fails, the external controller can apply the appropriate error recovery measures as before.

In a variation of the single register embodiment of FIG. 10, a second register 403 can be provided so that it can be loaded with the next data in a stream process while steps 1–4 are performed using the first master data register 403. After the process is complete for the first register 403, the role of the two master data registers 403 is switched.

FIGS. 11 and 12 are a pair of timing diagrams to illustrate the use of stream programming, the action of issuing data intended for programming of subsequent sectors while programming the data currently in the registers, in the embodiment that allows this process.

The diagram of FIG. 11 shows a prior art example of a two-sector parallel programming operation followed by a single read of each and is based on a different protocol than that used in FIGS. 3 and 6. The exemplary protocol of FIG. 11, and also below in FIG. 12, is more flexible and more descriptive, allowing easier explanation of the concepts. To briefly explain the interface depicted, the ALE line is active high when an address is issued to the memory, the CLE line is active high when a command is issued to the memory, the $\overline{WE}$ line clocks data, addresses and commands written to the memory, the $\overline{RE}$ line clocks data, addresses and commands read from the memory, the R/$\overline{B}$ line is active low when the memory device is performing a read, write, or erase operation on the memory array. Sequences C.1.A and C.1.B are read processes where the data is transferred off of the memory device, with DATA N and DATA N+1, respectively, on the I/O line when $\overline{RE}$ goes low. The embodiment of FIG. 11 may be extended to the case of two reads for each sector by, for example, repeating Sequences C1.A and C1.B, and starting each set of sequences with a different command. For example, issuing the sequences once, each starting with a command READ1 CMD, and then again with READ2 CMD, to indicate different read conditions. An alternate embodiment may entail issuing some set of parameters in the form of data before each read command.

Prior art implementations of a similar interface depicted in FIG. 11 ignore any activity over the interface while the part is busy, though the stream programming implementation aspect of the present invention would require the memory device to permit it. The diagrams of FIGS. 11 and 12 depict one possible implementation within the framework of the interface, and other timing diagrams are possible. The XFER CMD initiates a data transfer to the memory device, and the CACHE CMD completes a data transfer to the memory. The PGM CMD can be used to trigger the transfer of data from the master register to the slave and compare registers. Both the ADDR and the DATA phase will in practice consist of several cycles. Following the data write, occurring the first time the R/$\overline{B}$ line goes low, the STAT CMD and STAT provide the status of the program operations, including the program-verify phase determining if the target levels have been reached. Again, the verify that occurs as part of the program operation is separate from the process of the present invention, which is based on a read and is subsequent to the completion of the write process.

FIG. 12 shows a partial timing diagram for an example of two-sector parallel programming operation, with "stream-programming" followed by a single compare verify of each sector. This basic diagram contains the elements for a number of different embodiments, if the various elements are rearranged, altered and repeated, or omitted.

A first set of embodiments performs two-sector parallel programming, stream-programming, and single post-write compare-verify. This is the example shown in FIG. 12. Following the transfer of the first two sectors of data (N and N+1), these two sectors are programmed into the memory array when R/$\overline{B}$ is low. While these sectors are being written, the next two sectors (N+2 and N+3) are transferred into the master data register in Sequence C2.A. (This particular variation would use a three register implementation or a two register, non-destructive implementation in which the output of the array is directly compared to the register.) This is followed by Sequence C2.B, in which the data stored at address N is read and compared, and by Sequence C2.C, in which the data stored at address N+1 is read and compared. The remainder of Sequence C2.C that continues beyond the shown portion of the diagram is completed as is Sequence C2.B.

There is a choice as to where in the sequence the new data transfer of Sequence C2.A is started. The examples shown in FIGS. 3 and 6 show the data transfer starting after the programming operation proper, and during the subsequent read-verify. Because the read operations are short relative to the accumulated time of several data transfers required for parallel programming operation, some of the data transfer time would not be performed in parallel with flash memory operation. Any data transfer time additional to the memory operation time will degrade performance relative to the case in which it is all performed in parallel. FIGS. 11 and 12 show the data transfer starting during the program operation. Because the program operation is long, and is followed by the read-verify operations, much more of the data transfer time will be performed in parallel with the memory operations. This will result in a much smaller degradation in performance, if any. In FIG. 12, the signals STAT CMD and STAT occurring between Sequence C2.A and Sequence C2.B needs to be distinguished from the signals STAT CMD and STAT occurring within Sequence C2.B and Sequence C2.C. The STAT CMD and STAT between the sequences C2.A and C2.B provide the status of the program operations performed during the R/$\overline{B}$ signal, including the program-verify phase determining if the target levels have been reached. The STAT CMD and STAT forming part of the sequences C2.B and C2.C provide the status of the post-write read-verify operations of the present invention. More generally, different commands may be employed in alternate embodiments, with one command for program verify status and another one for the read-verify process. In comparing sequence C2.B of FIG. 12 with sequence C1.A, it should be noted that sequence C1.A ends with the data being transferred off the memory, while sequence C2.B with only the status being transferred. In an alternate embodiment, the data may be compared in parallel, and Sequence C2.B altered to issue both addresses. For example, the combined C2.B/C2.C sequence could be. CMP1 CMD, ADDR N, ADDR N+1, CMP EXEC CMD, STAT CMD, STAT, where the extra CMP EXEC CMD is used to indicate that all addresses to be compared have been issued.

In another alternate embodiment, the memory may perform the compare sequences automatically after a programming operation, thus not requiring Sequences C2.B and C2.C, in which case the status phase after the programming operation would include status of the compare.

Another set of embodiments performs two-sector parallel programming, stream-programming, and multiple post-write compare-verifies. This sequence may be extended to the case of two compares for each sector by, for example, repeating Sequences C2.B and C2.C, and starting each set of sequences with a different command. For example, issuing the sequences once starting with a command CMP1 CMD, and then again with CMP2 CMD, to indicate different read conditions. An alternate embodiment may entail issuing some set of parameters, such as voltage level values to be used for the read, in the form of data before each read command. In another embodiment, the memory may automate the post-write compares as described above, where the status phase of the programming would include status of the compare.

Yet another set of embodiments performs two-sector programming, no stream programming, and any number of post-write compare-verifies. These embodiments can be implemented in the two or one register embodiments of FIGS. 9 and 10. The sequence may be altered to perform the programming without stream-programming by removing Sequence C2.A from its place in the diagram. Data intended for the subsequent sectors would be issued in a sequence as in the modified FIG. 12, but with addresses N+2, and N+3. All of the alternate embodiments described above apply.

As noted above, different read conditions can be used for the read process of the post-write compare-verify. For embodiments using multiple compare-verifies, each of the multiple individual reads used for the multiple compares can be performed with a different margin read condition. The following discussion is given in terms of multi-state non-volatile storage units, with the binary case following readily. Additionally, although the examples show two-sector parallel operation, the invention applies in the case of one-sector or any number of sectors in parallel.

FIG. 13 depicts an exemplary distribution of cell populations and margin read conditions in a four-state memory, and shows two possible sets of margin read conditions; one biased toward high programmed states and one towards low programmed states. More detail on the various margining levels and their uses are presented in U.S. Pat. No. 5,532,962 and U.S. patent application Ser. No. 09/671,793, filed Sep. 27, 2000, both of which are hereby incorporated by reference.

The example shown in FIG. 13 is that of a current-sensing memory system, in which the current of the storage unit under a certain read condition is compared with a set of reference currents. In other memory systems the state of a storage unit can be determined using a number of different parameters. In the examples below, the determination of a cell's stored charge level can be performed by current sensing, where the magnitude of its conduction, using fixed bias conditions, is sensed. Alternately, such determination can be made through sensing threshold voltage, where the onset of such conduction is sensed using varied steering gate bias conditions. These methods represent a couple of the more standard approaches.

Alternately, the determination could be performed dynamically by having the cells' charge-level determined driver-strength control the discharge rate of a dynamically held (by, e.g., a pre-charged capacitor) sense node. By sensing the time to reach a given discharge level, the stored charge level is determined. In this case, the parameter indicative of the cell's condition is a time. This approach is described in U.S. Pat. No. 6,222,762 and in a U.S. patent application entitled "Sense Amplifier for Multilevel Non-Volatile Integrated Memory Devices" by Shahzad Khalid, filed on Nov. 20, 2001, both of which are hereby incorporated by reference. Another alternative technique is one in which the state of the storage units is determined using frequency as the parameter, an approach described in U.S. Pat. No. 6,044,019, which is also hereby incorporated by reference.

Current sensing approaches are more fully developed in U.S. Pat. No. 5,172,338, which was included by reference above, and U.S. patent application Ser. No. 08/910,947, which is hereby incorporated by reference, and may be employed with the various embodiments described of the present invention. The threshold voltage, $V_{th}$, sensing approach (alternately termed voltage margining) may be preferable in some instances since this improves the sensing resolution, keeps the current, and consequently the power associated with massively parallel read operations low, and minimizes vulnerability to high bit line resistance. The $V_{th}$ sensing, or voltage margining, approach is developed more fully in U.S. Pat. No. 6,222,762. Another technique of voltage sensing, where the voltage at the source for a fixed drain voltage in response to a given gate voltage, is the source follower technique that is described, for example in U.S. patent application Ser. No. 09/671,793, incorporated by reference above.

FIG. 14 depicts an exemplary manner of altering the read conditions. This example shows a current sensing technique in which a margin current (Margin1, Margin2, Margin3) is added (1401, 1402, 1403) to the reference current (Reference Current 1, Reference Current 2, Reference Current 3), the sum of which is compared (1411, 1412, 1413, 1420) to the cell output current. The example shows a parallel read for the three breakpoints and requires that all reference levels be present simultaneously, whereas in another embodiment the read may involve multiple stages in a search through the reference space using a single reference voltage or current. In a multiple compare process, the margin current values could change for the different compares. The type of read will depend on the particular scheme. The exemplary embodiment of FIG. 14 uses three reference currents to distinguish the four states, while other embodiments could use four reference currents, as is developed more fully in U.S. Pat. Nos. 5,172,338 and 5,095,344 that were incorporated by reference above.

The various aspects of the present invention can also be used in the case of addressing by level in multi-state memory systems. This scheme entails mapping two separately addressable host data sectors, designated "upper page" and "lower page", to the same set of cells in a four-state memory. In this scheme, each bit of the lower page's data programmed to one of two cell states in a given cell, and each bit of the upper page's data programmed to modify the state of each given cell based on the given bit's value. The scheme is extensible to higher number of state per cell. This is described more fully in U.S. patent application Ser. No. 09/893,277 filed on Jun. 27, 2001, which is hereby incorporated by reference, and is briefly presented here. FIG. 15 shows one such embodiment of state allocation for a four-state cell, and usage in such a scheme with exemplary voltage values.

FIG. 16 shows register usage for an implementation of the present invention in an addressing by state scheme. In the diagram, it is shown that to read the lower page (from MEMORY ARRAY 400 including DESTINATION SECTOR), it is necessary to first read at the granularity of the upper page (0.8V discrimination point in FIG. 15) and to store the results in a register, Register 1 (404a). Step 1 is a normal read of the upper page and step 2 uses the previously read data of the upper page to set the condition of the subsequent read of the lower page. The lower page is read during the second stage read into a second register, Register 2 (404b), with the upper page data fed back to the sensing circuitry to set appropriate read conditions on a bit-by-bit basis. So in effect, two registers are required for a single read. Note, however, that only one of the two registers is required to be compared with the compare register, as it will contain the data in question. A read of the upper page only requires one read stage, and one register. To add stream-programming capabilities, a fourth register, Register 4 (403), is added as a Master register. Some memories may operate in both two- and four-state. In two-state mode, the memory may use the extra register, Register 1 (404a), required for first phase read in multi-state for other purposes, such as stream-programming.

In the four state operation, Register 1 (404a) and Register 2 (404b) both serve as slave registers, Register 3 (405) is a compare register, and Register 4 (403) serves as the master register. In a two-state mode of operation, the registers as related to previous diagrams may be described as follows: Register 1 (404a) would be the Slave register, Register 4 (403) would be the Master register, Register 3 (405) would be the Compare register, and there is no current planned use for Register 2 (404b). In a prior art implementation that uses the above scheme upper page/lower page read scheme, Register 3(405) and Register 4 (403) are lacking and only the pair Register 1 (404a) and Register 2 (404b) are present. Register 3(405) and Register 4 (403) are added for the purposes of the invention.

Many aspect of the present invention are not particular to the details of the type of storage unit used in the memory array. Although the discussion so far has focussed on embodiments using a charge storing device, such as floating gate EEPROM or FLASH cells, for the memory device, it can be applied to memory systems using other forms of storage unit. This invention can be used in memory systems, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used. For these other cell types, the particular mechanics of the read and write processes may differ, but the extension of the various aspects of the present invention follows readily from the examples above.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, although the preferred embodiment described herein is directed to memories using semiconductor-based solid-state microelectronics, it will be appreciated by those skilled in the art that the teachings of the present invention can be adapted to other memories using molecular-scale organic or chemical switches. Thus, the scope of the appended claims should not be limited to the preferred embodiments described herein.

What is claimed is:

1. A non-volatile memory device comprising:
   an array of non-volatile storage units;
   a master d at a register for receiving data to be stored in said array, wherein the master data register maintains said data to be stored in said array subsequent to said data to be stored in said array being stored in said array;
   a slave data register for receiving data from said array; and
   a comparison circuit for comparing data stored in said slave data register and said master data register, for verifying correct programming of data in said array.

2. A device as in claim 1, wherein said storage units comprise flash memory cells.

3. A device as in claim 1, wherein said storage units comprise NROM memory cells.

4. A device as in claim 1, wherein said storage units comprise magnetic memory cells.

5. A device as in claim 1, wherein said storage units are multi-state storage units.

6. A device as in claim 1, wherein said data to be stored in said array comprises a plurality of sectors of data, further comprising:
   write circuitry, wherein said write circuitry stores said plurality of sectors of data in said array in parallel.

7. A device as in claim 6, wherein said comparison circuit compares multiple sectors of said plurality of sectors of data stored in said slave data register and said master data register in parallel.

8. A device as in claim 6, wherein said comparison circuit compares said plurality of sectors of data stored in said slave data register and said master data register serially a sector at a time.

9. A system comprising:
   a memory device as in claim 1; and
   a controller.

10. A system as in claim 9, wherein said comparison circuit performs said comparing in response to a command issued by said controller.

11. A system as in claim 9, wherein said comparison circuit performs said comparing in a process initiated by said memory device independently of said controller.

12. A device as in claim 9, further comprising:
   sense circuitry to read data from said array and supply the data to said slave register, wherein said controller specifies one or parameters for reading the data.

13. A device as in claim 1, wherein said comparison circuit performs said comparing in response to a command, further comprising:
   sense circuitry to read data from said array and supply the data to said slave register, wherein said command specifies conditions for reading the data.

14. A non-volatile memory device comprising:
   an array of non-volatile storage units;
   a master data register for receiving data to be stored in said array, wherein the master data register maintains said data to be stored in said array subsequent to said data to be stored in said array being stored in said array;
   sense circuitry to read data from said array; and
   a comparison circuit connected to said sense circuitry for comparing data read from said array and data stored in said master data register, for verifying correct programming of data in said array.

15. A device as in claim 14, wherein said storage units comprise flash memory cells.

16. A device as in claim 14, wherein said storage units comprise NROM memory cells.

17. A device as in claim 14, wherein said storage units comprise magnetic memory cells.

18. A device as in claim 14, wherein said storage units are multistate storage units.

19. A device as in claim 14, further comprising:
   a second master data register, wherein said second master data register receives and/or holds a subsequent set of data for programming in said array while said comparison is taking place.

20. A device as in claim 14, further comprising:
   a second master data register, wherein said second master data register receives and/or holds a subsequent set of data for programming in said array while said programming is taking place.

21. A device as in claim 14, wherein said data to be stored in said array comprises a plurality of sectors of data, further comprising:
   write circuitry, wherein said write circuitry stores said plurality of sectors of data in said array in parallel.

22. A device as in claim 21, wherein said sense circuitry reads multiple sectors of said plurality of sectors from said array and said comparison circuit compares multiple sectors of said plurality of sectors of data read from said array and data stored in said master data register in parallel.

23. A device as in claim 21, wherein said sense circuitry reads multiple sectors of said plurality of sectors from said array and said comparison circuit compares multiple sectors of said plurality of sectors of data read from said array and data stored in said master data register serially a sector at a time.

24. A system comprising:
   a memory device as in claim 14; and
   a controller.

25. A system as in claim 24, wherein said comparison circuit performs said comparing in response to a command issued by said controller.

26. A system as in claim 24, wherein said comparison circuit performs said comparing in a process initiated by said memory device independently of said controller.

27. A device as in claim 24, wherein said controller specifies one or parameters for reading the data from said array.

28. A device as in claim 14, wherein said comparison circuit performs said comparing in response to a command, and wherein said command specifies the conditions for reading the data from said array.

29. A non-volatile memory device comprising:
   an array of non-volatile storage units;
   a master data register for receiving data to be stored in said array;

a data compare register for receiving data from said master data register;

a write circuit for storing in said array said data to be stored in said array;

a slave data register for receiving data from said array; and a comparison circuit for comparing data stored in said slave data register and said data compare register, for verifying correct programming of data in said array.

30. A device as in claim 29, wherein said storage units are multi-state storage units.

31. A device as in claim 29, wherein said data to be stored in said array comprises a plurality of sectors of data, and wherein said write circuitry stores in parallel in said array said plurality of sectors of data in said array in parallel.

32. A device as in claim 31, wherein said comparison circuit compares multiple sectors of said plurality of sectors of data in said slave data register and said data compare register in parallel.

33. A device as in claim 31, wherein said comparison circuit compares multiple sectors of said plurality of sectors of data in said slave data register and said data compare register serially.

34. A system comprising:

a memory device as in claim 29; and a controller, wherein said comparison circuit performs said comparing in response to a command issued by said controller.

35. A device as in claim 34, wherein said comparison circuit performs said comparing in response to a command, further comprising:

sense circuitry to read data from said array and supply the date to said slave register, wherein said command specifies one or parameters for reading the data.

36. A system comprising:

a memory device as in claim 29; and a controller, wherein said comparison circuit performs said comparing in a process initiated by said memory device independently of said controller.

37. A device as in claim 29, wherein said comparison circuit performs said comparing in response to a command, further comprising:

sense circuitry to read data from said array and supply the data to said slave register, wherein said command specifies conditions for reading the data.

38. A method for operating a non-volatile memory device comprising the steps of:

receiving first data to be stored in an array of non-volatile storage units;

storing said first data in a master data register;

programming said first data into said array while maintaining said first data in said master data register;

reading said first data as stored in said array;

storing said read first data into a slave data register; and comparing the data stored in said slave data register and said master data register, for verifying correct programming of data in said array.

39. A method as in claim 38, wherein data is transferred from said master data register to said slave data register prior to said step of programming.

40. A method as in claim 38, which further includes, as a result of said step of comparing indicating an incorrect programming of data in said array, an additional step of performing error recovery measures.

41. A method as in claim 40, which further comprises the step of, subsequent to said step of performing error recovery measures, repeating said steps of reading and comparing.

42. A method as in claim 38, further comprising, subsequent to said comparing, repeating said reading, storing, and comparing.

43. A method as in claim 42, wherein the reading prior to said comparing and the repeated reading subsequent to said comparing are performed with a different set of read conditions.

44. A method as in claim 38, wherein said first data comprises a plurality of sectors and wherein said programming comprises programming the plurality of sectors in parallel into said array.

45. A method as in claim 44, wherein said reading, storing, and comparing are performed on multiple ones of said plurality of sectors in parallel.

46. A method as in claim 44, wherein said reading, storing, and comparing are performed on said plurality of sectors serially.

47. A method as in claim 38, wherein said reading, storing, and comparing are performed in response to a command.

48. A method as in claim 47, wherein said command originates externally to the memory device.

49. A method as in claim 47, wherein said command is internally generated by the memory device.

50. A method as in claim 47, wherein said command specifies conditions for said reading.

51. A method as in claim 47, wherein said command specifies one or parameters for said reading.

52. A method for operating a non-volatile memory device comprising the steps of:

receiving first data to be stored in an array of non-volatile storage units;

storing said first data in a master data register;

programming said first data into said array while maintaining said first data in said master data register;

reading said first data as stored in said array; and comparing the first data as read and the data stored in said master data register, for verifying correct programming of data in said array.

53. A method as in claim 52, which further includes, as a result of said step of comparing indicating an incorrect programming of data in said array, an additional step of performing error recovery measures.

54. A method as in claim 53, which further comprises the step of, subsequent to said step of performing error recovery measures, repeating said steps of reading and comparing.

55. A method as in claim 52, further comprising, subsequent to said comparing, repeating said reading, storing, and comparing.

56. A method as in claim 55, wherein the reading prior to said comparing and the repeated reading subsequent to said comparing are performed with a different set of read conditions.

57. A method as in claim 52, wherein said first data comprises a plurality of sectors and wherein said programming comprises programming the plurality of sectors in parallel into said array.

58. A method as in claim 57, wherein said reading, storing, and comparing are performed on multiple ones of said plurality of sectors in parallel.

59. A method as in claim 57, wherein said reading, storing, and comparing are performed on said plurality of sectors serially.

60. A method as in claim 52, wherein said reading, storing, and comparing are performed in response to a control signal.

61. A method as in claim 60, wherein said control signal originates externally to the memory device.

62. A method as in claim 60, wherein said control signal is internally generated by the memory device.

63. A method as in claim 60, wherein said control signal specifies the conditions for said reading.

64. A method as in claim 60, wherein said control signal specifies one or parameters for said reading.

65. A method for operating a non-volatile memory device comprising the steps of:

receiving first data to be stored in an array of non-volatile storage units; storing said first data in a master data register;

storing said first data in a data compare register;

programming said first data into said array;

reading said first data as stored in said array;

storing said read first data into a slave data register;

comparing the data stored in said slave data register and the data stored in said data compare register, for verifying correct programming of data in said array; and subsequently repeating said reading, storing said read first data into a slave data register, and comparing.

66. A method as in claim 65, wherein the reading prior to said comparing and the repeated reading subsequent to said comparing are performed with a different set of read conditions.

67. A method for operating a non-volatile memory device comprising the steps of:

receiving first data to be stored in an array of non-volatile storage units;

storing said first data in a master data register;

storing said first data in a data compare register;

programming said first data into said array, wherein said first data comprises a plurality of sectors and wherein said programming comprises programming the plurality of sectors in parallel into said array;

reading said first data as stored in said array;

storing said read first data into a slave data register; and comparing the data stored in said slave data register and the data stored in said data compare register, for verifying correct programming of data in said array.

68. A method as in claim 67, wherein said reading, storing, and comparing are performed on multiple ones of said plurality of sectors in parallel.

69. A method as in claim 67, wherein said reading, storing, and comparing are performed on said plurality of sectors serially a sector at a time.

70. A method for operating a non-volatile memory device comprising the steps of:

receiving first data to be stored in an array of non-volatile storage units;

storing said first data in a master data register;

storing said first data in a data compare register;

programming said first data into said array; and in response to a control signal:
reading said first data as stored in said array;
storing said read first data into a slave data register; and
comparing the data stored in said slave data register and the data stored in said data compare register, for verifying correct programming of data in said array.

71. A method as in claim 70, wherein said control signal originates externally to the memory device.

72. A method as in claim 70, wherein said control signal is internally generated by the memory device.

73. A method as in claim 70, wherein said control signal specifies the conditions for said reading.

74. A method as in claim 70, wherein said control signal specifies one or more parameters for said reading.

75. A method for operating a non-volatile memory device comprising the steps of:

receiving first data to be stored in an array of non-volatile storage units logically organized into one or more sets, wherein each set of storage units stores a plurality of separately addressable host data sectors, and wherein said first data comprises a plurality of sectors of data;

storing said first data in a master data register;

storing a first sector of said first data in a data compare register;

programming said first data into said array;

reading a second sector of said first data as stored in said array;

storing said read second sector of said first data into a first slave data register;

reading said first sector of said first data as stored in said array using the condition of said read second sector of said first data;

storing said read first sector of said first data into a second slave data register; and comparing the data stored in said second slave data register and the data stored in said data compare register, for verifying correct programming of data in said array.

* * * * *